United States Patent
Greim et al.

(10) Patent No.: US 7,965,082 B2
(45) Date of Patent: Jun. 21, 2011

(54) MAGNETIC RESONANCE RADIO FREQUENCY SYSTEM AND OPERATING METHOD THEREFOR

(75) Inventors: Helmut Greim, Adelsdorf (DE); Markus Vester, Nuremberg (DE); Jian Min Wang, ShenZhen (CN); Wei Dong Wang, Shenzhen (CN); Yao Xing, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 155 days.

(21) Appl. No.: 12/420,140

(22) Filed: Apr. 8, 2009

(65) Prior Publication Data
US 2009/0256564 A1   Oct. 15, 2009

(30) Foreign Application Priority Data
Apr. 8, 2008  (CN) .......................... 2008 1 0090994

(51) Int. Cl.
*G01V 3/00*  (2006.01)
(52) U.S. Cl. ........................................ 324/318; 324/322
(58) Field of Classification Search .................. 324/318, 324/322
See application file for complete search history.

(56) References Cited

U.S. PATENT DOCUMENTS

| 5,999,000 | A * | 12/1999 | Srinivasan | 324/318 |
| 7,486,077 | B2 * | 2/2009 | Hergt et al. | 324/318 |
| 7,592,813 | B2 * | 9/2009 | Boskamp et al. | 324/322 |
| 7,764,065 | B2 * | 7/2010 | Biber et al. | 324/318 |

* cited by examiner

*Primary Examiner* — Louis M Arana
(74) *Attorney, Agent, or Firm* — Schiff Hardin LLP

(57) ABSTRACT

In a method for processing radio frequency signals of a magnetic resonance imaging system in which the coil portion of the magnetic resonance imaging system includes a body coil and a local coil, radio frequency signals are supplied to the body coil, and these radio frequency signals are coupled to said local coil, and transmitted by said local coil into a region to be examined. A corresponding radio frequency system has a local coil and a body coil, with power coupling between the local coil and the body coil; during the phase for transmitting the radio frequency signals. The body coil serves to couple the radio frequency signals to be transmitted to the local coil, and the local coil serves to transmit the coupled radio frequency signals to a region to be examined. This method and system allow the transmitting function of the local coil to be achieved without having a coil plug on a patient bed to provide a radio frequency signal transmitting channel.

15 Claims, 3 Drawing Sheets

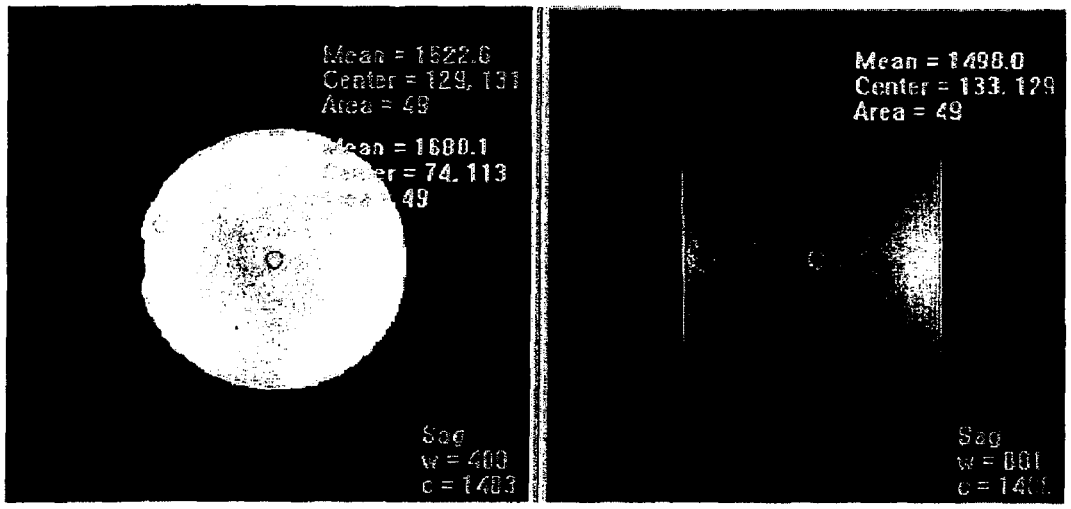
*Fig. 5(a)*        *Fig. 5(b)*
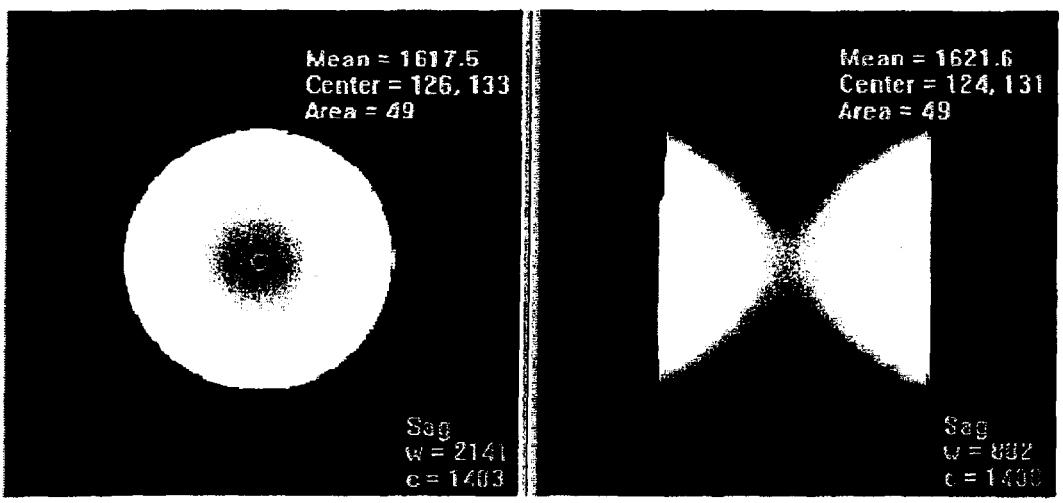
*Fig. 6(a)*        *Fig. 6(b)*

MAGNETIC RESONANCE RADIO FREQUENCY SYSTEM AND OPERATING METHOD THEREFOR

BACKGROUND OF THE INVENTION

1. Field of the Invention

The present invention relates to the processing of radio frequency signals in a magnetic resonance imaging system and, particularly, to a method for processing radio frequency signals capable of transmitting radio frequency signals without a radio frequency signal transmitting channel provided by a coil plug on a patient bed, and to a radio frequency system for realizing the abovementioned radio frequency signal processing method.

2. Description of the Prior Art

A magnetic resonance imaging (MRI) system includes many types of coils, such as a body coil for covering an entire human body, a local coil for covering only a certain part of a human body, etc. The body coil is a self-transmitting and self-receiving coil. Generally speaking, since the coverage range of the body coil is larger, it needs a relatively high transmitting power, the signal-to-noise ratio of the images obtained is relatively low, and the signal-to-noise ratios at different positions in an image are not uniform. In case of the local coil, since its coverage range is relatively small, such as, for example, the knee region covered by a knee coil, the head region covered by a head coil, and the wrist region covered by a wrist coil, etc., the local coil receives only the radio frequency signals within a limited radio frequency excitation range (in order to distinguish them from the radio frequency signals in a transmitting phase, the radio frequency signals received by the coils are referred to as magnetic resonance signals hereafter), therefore, the signal-to-noise ratio of the image that is obtained is higher, and the signal-to-noise ratios at different positions in an image are relatively uniform.

For certain magnetic resonance systems in which a coil plug on a patient bed provides a radio frequency signal transmitting channel, a local coil connected to this type of coil plug can be designed as a self-transmitting and self-receiving coil. A local coil with the functions of a transmitting coil has a number of advantages in magnetic resonance applications, such as reducing the specific absorption rate (SAR), avoiding image fold-over problems due to imaging areas being too small, etc. In order to transmit the radio frequency signals from the coil plug and to send the received magnetic resonance signals via the coil plug to downstream devices such as an amplifier, such a self-transmitting and self-receiving local coil needs to have a switch for switching between transmitting and receiving modes, which is capable of undertaking high power radio frequency signals. The incorporation of the switch for switching between transmitting and receiving, however, not only makes the structure of the local coil complicated but also increases the cost of the local coil.

Furthermore, for those magnetic resonance imaging systems that do not provide any coil plug on the patient bed for radio frequency signal transmitting channels, since the abovementioned self-transmitting and self-receiving local coil cannot obtain from the coil plug the radio frequency signals for transmitting, the abovementioned self-transmitting and self-receiving coils cannot be used in this type of magnetic resonance imaging system, which can only use a local coil having only the receiving functions.

Therefore, it has become an urgent problem to be solved in the magnetic resonance imaging field regarding how to realize the transmission of radio frequency signals via a local coil without relying on a coil plug on a patient bed.

SUMMARY OF THE INVENTION

An object of the present invention is to provide a method for processing radio frequency signals in which radio frequency signals are transmitted without relying on a radio frequency signal transmitting channel by a coil plug on a patient bed. The present invention also encompasses a radio frequency system for realizing the abovementioned method for processing radio frequency signals.

The above object is achieved in accordance with the present invention by a method for processing radio frequency signals in a magnetic resonance imaging system having a body coil and a local coil, the method including providing radio frequency signals to the body coil to be transmitted and, with the body coil, coupling the radio frequency signals to the local coil, and emitting the radio frequency signals from said local coil into a region to be examined.

The method can further include adjusting the local coil in advance so as to make the local coil form power coupling with said body coil.

The adjusting step can include arranging a capacitor respectively in each of a number of coil units of the local coil; and adjusting the capacitors so as to make a primary mode frequency of the local coil equal to a primary mode frequency of the body coil.

The method can further include receiving, with the local coil, magnetic resonance signals from the region to be examined, and coupling the magnetic resonance signals to the body coil.

The method can further include receiving by said local coil magnetic resonance signals from said region to be examined, and outputting said magnetic resonance signals from said local coil via a plurality of radio frequency cables.

The method can further include arranging in advance, in each of said coil units, a decoupling component for eliminating the coupling between said coil units, and eliminating the coupling between the coil units by means of the decoupling components during a phase for receiving the magnetic resonance signals.

The method can further include arranging in advance a switch circuit in each of the coil units; and switching off the radio frequency channels of the radio frequency cables by means of the switch circuits during the phase for transmitting radio frequency signals.

The method can further include arranging in advance a bypass respectively for each of the decoupling components, and short-circuiting the decoupling components by means of the bypasses during a phase for transmitting the radio frequency signals.

The method for processing radio frequency signals in accordance with the present invention, in the phase for transmitting the radio frequency signals, does not rely on the radio frequency signal transmitting channel by the coil plug on the patient bed, and this method can be used in those magnetic resonance imaging systems in which the coil plug does not provide a radio frequency signal transmitting channel. Furthermore, in the present invention it is not necessary to introduce into a local coil a switch for switching between transmitting and receiving, and thus it can reduce the costs of the local coil, the patient bed and even the entire magnetic resonance imaging system.

The above object also is achieved in accordance with the present invention by a radio frequency system having a local coil and a body coil arranged to produce power coupling between the local coil and the body coil; and during a phase for transmitting radio frequency signals, the body coil serves to couple the radio frequency signals to be transmitted to the local coil, and the local coil serves to emit (radiate) said coupled radio frequency signals into a region to be examined.

The local coil can be formed by a number of coil units, and the multiple coil units can form a cylinder, or a number of cylinders adjacent in succession to one another in the axial direction. Within said cylinder, the coil units are connected to one another in succession in the circumferential direction of the cylinder. Each of the coil units includes a capacitor, the capacitors each being located at the edge of the respective coil unit at the same bottom face of the cylinder. The capacitors are used for adjustment, so as to make the local coil and the body coil participate in the power coupling.

In the above embodiment, the respective coil units located in the cylinder at any each of the local coil converge toward the end face of that end.

Within the cylinder, in each coil unit, the aforementioned capacitor is connected in that coil unit at the edge thereof at the bottom face of the cylinder.

Each of the capacitors is located in the middle of the aforementioned edge.

The capacitor can be adjustable so as to make a primary mode frequency of the local coil equal to a primary mode frequency of the body coil.

The local coil can further have second capacitors for eliminating couplings between the coil units, with the number of the second capacitors being equal to the number of the coil units, and they are located respectively at the connected edges of every two connected coils. Each of the second capacitors is also connected in parallel with a diode, and the diodes are conductive during the phase for transmitting the radio frequency signals, and are blocking (non-conductive) during the phase for receiving magnetic resonance signals.

The local coil can further include third capacitors, with the number of the third capacitors being equal to the number of the coil units. The third capacitors are located respectively in the respective coil units at the edges at the other bottom face of the cylinder.

A first node and a second node at two ends of each of the third capacitors are respectively connected with radio frequency cables for emitting as an output the magnetic resonance signals received by the coil units.

A fourth capacitor, an inductor and a second diode are connected in each of the radio frequency cables. The inductor and the second diode are connected in series, and this series circuit and the fourth capacitor are connected in parallel between said first node and a third node in the radio frequency cables. The second diode is conductive during the phase for transmitting the radio frequency signals, and is blocking during the phase for receiving the magnetic resonance signals.

A second inductor is connected between each of the second nodes and the respective third node, and a fifth capacitor is connected at the third node.

It can be seen from the above-described embodiments that, since the local coil of the radio frequency system of the present invention can be adjusted so as to make the local coil and the body coil exhibit power coupling with each other, radio frequency signals can be coupled through the body coil to the local coil during the phase for transmitting radio frequency signals, and then be transmitted from the local coil to a region to be examined, so that such a local coil does not need to rely on a radio frequency signal transmitting channel by a coil plug on the patient bed during the phase for transmitting radio frequency signals, and thus it can be used in those magnetic resonance imaging systems in which the patient bed has no coil plug. Furthermore, it is also unnecessary for the local coil provided by the present invention to incorporate a switch for switching between transmitting and receiving, thereby it simplifies the structure of the local coil and reduces the costs of the local coil.

BRIEF DESCRIPTION OF THE DRAWINGS

FIG. 5($a$) is a computer screen shot of the signal-to-noise ratio of a cross-section image obtained by experiments with the local coil as shown in FIG. 2; and FIG. 5($b$) is a computer screen shot of the signal-to-noise ratio of a sagittal plane image obtained by experiments with the local coil as shown in FIG. 2.

FIG. 6($a$) is a computer screen shot of the signal-to-noise ratio of a cross-section image obtained by experiments with the local coil as shown in FIG. 3 and FIG. 4; and FIG. 6($b$) is a computer screen shot of the signal-to-noise ratio of a sagittal plane image obtained by experiments with the local coil as shown in FIG. 3 and FIG. 4.

DESCRIPTION OF THE PREFERRED EMBODIMENTS

Figure 1:
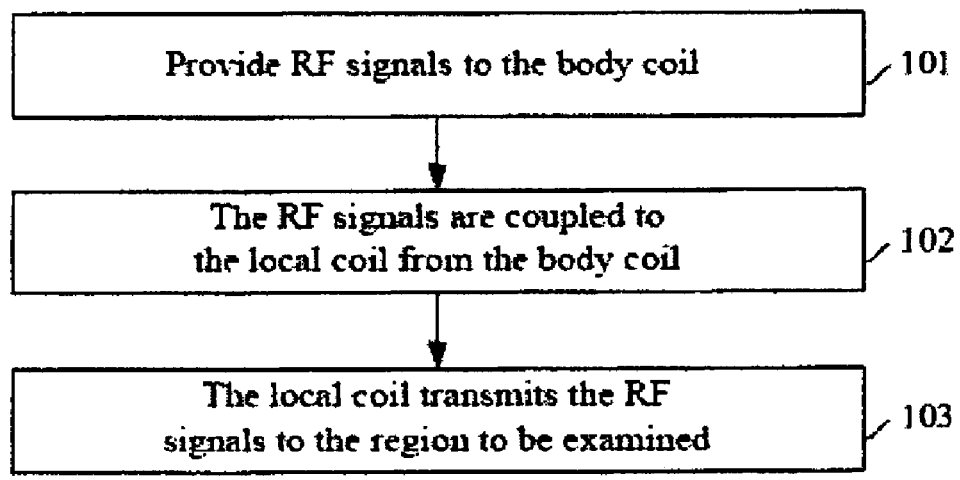
FIG. 1 is a flowchart diagram of a method for transmitting radio frequency signals according to an embodiment of the present invention.

FIG. 1 is a flowchart of a method for transmitting radio frequency signals according to the embodiment of the present invention. This method for transmitting radio frequency signals is suitable for a magnetic resonance imaging system having a body coil and a local coil, and power coupling can be formed between the local coil and the body coil, for example, the primary mode frequency of the local coil is close to or equals the primary mode frequency of the body coil. Preferably, the primary mode frequency of the local coil and the primary mode frequency of the body coil are equal, because in this case the coupling efficiency is the highest.

As shown in FIG. 1, the method for transmitting radio frequency signals of the present invention comprises the following steps:

Step 101, radio frequency signals are provided to the body coil via existing circuits in a magnetic resonance imaging system.

Step 102, due to the power coupling formed between the local coil and the body coil, the radio frequency signals provided to the body coil are coupled from the body coil to the local coil.

Step 103, the local coil transmits the radio frequency signals coupled thereto from the body coil to a region to be examined, and sends the transmitting power evenly over the region to be examined surrounded by the local coil.

In case no power coupling has been formed between the local coil and the body coil, the above method can adjust the local coil in advance, so that the power coupling is formed between the local coil and the body coil, and thus step 101 to step 103 can be successfully implemented. For example, a capacitor is arranged respectively in each of a number of coil units of the local coil, and these capacitors are adjusted, so that the primary mode frequency of the local coil equals or is close to the primary mode frequency of the body coil, thereby power coupling is formed between the two.

The abovementioned method can be adopted in magnetic resonance imaging systems in which no radio frequency signal transmitting channel is provided in the coil plug. Furthermore, since in the method it is not necessary for the coil plug on the patient bed to provide the radio frequency signal transmitting channel, and it is not necessary either to introduce into the local coil a switch for switching between transmitting and receiving, therefore the costs of the local coil, the patient bed, and even the entire magnetic resonance imaging system can be reduced.

The local coil receives the magnetic resonance signals from the region to be examined during the phase for receiving magnetic resonance signals, then it can couple the received magnetic resonance signals to the body coil, and then the magnetic resonance signals are transferred by the body coil to subsequent devices, such as an amplifier, an image reconstructing system, etc. via the existing circuits in the magnetic resonance imaging system.

After the local coil has received the magnetic resonance signals from the region to be examined, the magnetic resonance signals can also be transferred to the subsequent devices via the coil plug on the patient bed. The advantage of this method is that it is capable of realizing multi-channel receiving. Particularly, the local coil transfers the received magnetic resonance signals to the coil plug via a plurality of radio frequency cables between the local coil and the coil plug, and then the magnetic resonance signals are transferred to the subsequent devices via long radio frequency cables between the coil plug and the subsequent devices. In this case, a switch circuit can be arranged in advance in each of said coil units; and during the phase for transmitting the radio frequency signals, the radio frequency channels are switched off by using the switch circuits, so as to prevent the radio frequency signals from damaging the subsequent amplifier.

In order to eliminate the coupling between the coil units, a decoupling component for eliminating the coupling between the coil units can be arranged in advance in each of said coil units, and the decoupling components can be used to eliminate the coupling between the coil units during the phase for receiving magnetic resonance signals. In order to eliminate the influence of the decoupling components during the phase for transmitting radio frequency signals, a bypass can be arranged in advance respectively for each of the decoupling components, and the bypasses can be used to short-circuit the decoupling components during the phase for transmitting radio frequency signals.

Therefore, by using the method of the embodiment of the present invention, it also provides flexible and various transferring and processing processes for the magnetic resonance signals during the phase for receiving magnetic resonance signals.

Described below is a radio frequency system which can be used to realize the abovementioned method in a magnetic resonance imaging system, in which the radio frequency system has a body coil and a local coil, and power coupling exists between the body coil and the local coil. The body coil can be an existing coil, therefore the structure of the body coil will not be described in detail here. The body coil can couple the radio frequency signals to be transmitted to the local coil during the phase for transmitting radio frequency signals via the coupling between the body coil itself and the local coil. Furthermore, during the phase for receiving magnetic resonance signals, it can also receive the magnetic resonance signals coupled from the local coil, and transfer the magnetic resonance signals to subsequent devices via the existing circuits in the magnetic resonance imaging system.

The local coil in the embodiments of the present invention can be of any shape for a receiving coil as long as the local coil can be adjusted to form power coupling with the body coil. In order to make the embodiments of the present invention more understandable to those skilled in the art, a local coil in the radio frequency system of the embodiments of the present invention will be described in detail below by taking a birdcage coil as an example.

(1) An Embodiment without a Receiving Cable or a Transmitting Cable

This type of local coil has a number of coil units, each of which has a first capacitor, in which the properties such as type, specification, etc. of these first capacitors can be different, but preferably they are the same, so as to facilitate their design, manufacture and adjustment. By adjusting these first capacitors, it enables the local coil and the body coil to form power coupling, and thereby the abovementioned radio frequency signal transmitting process can be implemented. Power coupling includes a plurality of cases, for example, making the primary mode frequency of the local coil close to or equal to the primary mode frequency of the body coil by adjusting the first capacitors, and in the case of the main mode frequencies of both of them being equal, the coupling efficiency can be the highest, thereby it can reduce the power consumed during the transmission.

Figure 2:
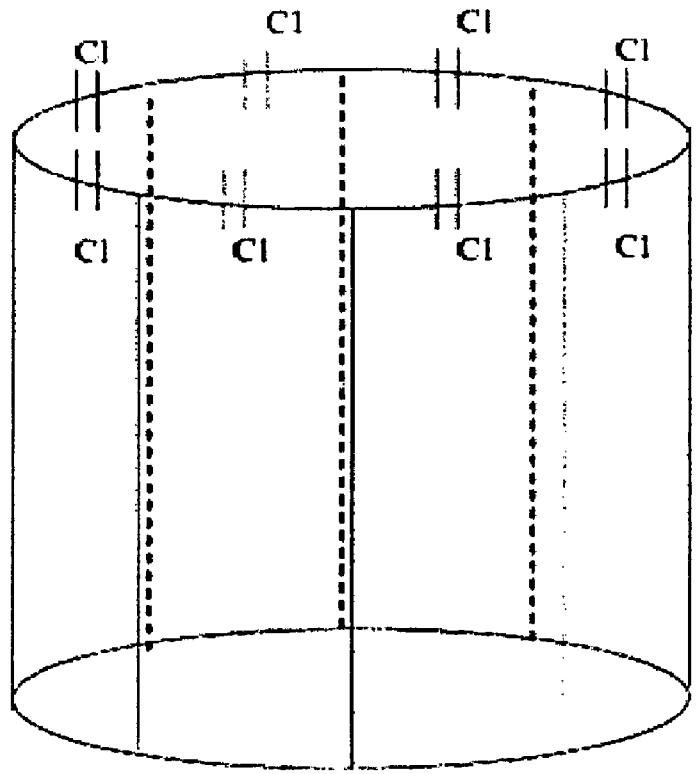
FIG. 2 is a schematic view of a local coil according to the embodiment of the present invention.

FIG. 2 is a schematic view of a local coil according to the embodiment of the present invention. As shown in FIG. 2, the local coil has 8 coil units, which form a cylinder, and are connected to one another in succession in a circumferential direction of the cylinder. Each of the coil units has a first capacitor C1. In the local coil shown in FIG. 2, the first capacitors C1 are each arranged respectively in one of these 8 coil units at the edges at the same bottom face of the cylinder. The first capacitor C1 is located preferably in the middle portion of a corresponding edge of the coil unit, and preferably it is located at the center position of the corresponding edge. These first capacitors C1 are adjustable, and by adjusting these first capacitors C1, the main mode frequency of the local coil can be made close to or equal to the main mode frequency of the body coil in the magnetic resonance imaging system. These first capacitors C1 can be of different properties. Preferably, these first capacitors C1 are of the same properties, so that it can facilitate the design, manufacturing and adjustment. In each of the coil units, at the edge opposite to the edge at which the first capacitor C1 shown in FIG. 2 is located, a first capacitor C1 can be arranged in the same way.

FIG. 2 shows an embodiment in which the local coil has only one cylinder. In addition, the local coil can also have a number of cylinders that are adjacent in axial direction and each of which is the same as the cylinder described above.

Furthermore, no matter whether the local coil unit has one or a number of cylinders, the coil units in the cylinder at one end of the local coil can further converge in this end face, and this type of structure converging at the end face is described in Chinese patent application 200810006468.6, and therefore need not be described herein. A local coil having this structure can be better applied in cases such as a head coil.

Radio frequency signals can be provided first to the body coil during the phase for transmitting radio frequency signals to the region to be examined, and since the primary mode frequency of the local coil in the radio frequency system equals to the primary mode frequency of the body coil, the radio frequency signals to be transmitted are coupled from the body coil to the local coil as shown in FIG. 2, and then the local coil transmits the radio frequency signals to the region to be examined.

During the process of receiving magnetic resonance signals, the local coil shown in FIG. 2 receives the magnetic resonance signals from the region to be examined, and since the main mode frequency is equal to the main mode frequency of the body coil, the received magnetic resonance signals are coupled from the local coil to the body coil, and are then sent from the body coil to the subsequent devices.

FIG. 5(a) is the computer screen shot of the signal-to-noise ratio of a cross-section image obtained by experiments with the local coil as shown in FIG. 2. FIG. 5(b) is the computer screen shot of the signal-to-noise ratio of a sagittal plane image obtained by experiments with the local coil as shown in FIG. 2. As shown in FIG. 5(a), the signal-to-noise ratio at the center of the cross-section image is 1522.6, and the maximum signal-to-noise ratio deviating from the center is 1680.1; and as shown in FIG. 5(b), the signal-to-noise ratio at the center of the sagittal plane image is 1498.0. This shows that, by using the local coil as shown in FIG. 2 of the embodiment of the present invention, the signal-to-noise ratios at various parts of the image can be made relatively uniform.

(2) Embodiment with a Receiving Cable but without a Transmitting Cable

During the phase for receiving magnetic resonance signals, in addition to being able to couple the received magnetic resonance signals to the body coil according to the above description, the local coil in the embodiment of the present invention can also send the received magnetic resonance signals to the subsequent devices via radio frequency cables, for example via the coil plug on the patient bed.

Figure 3:
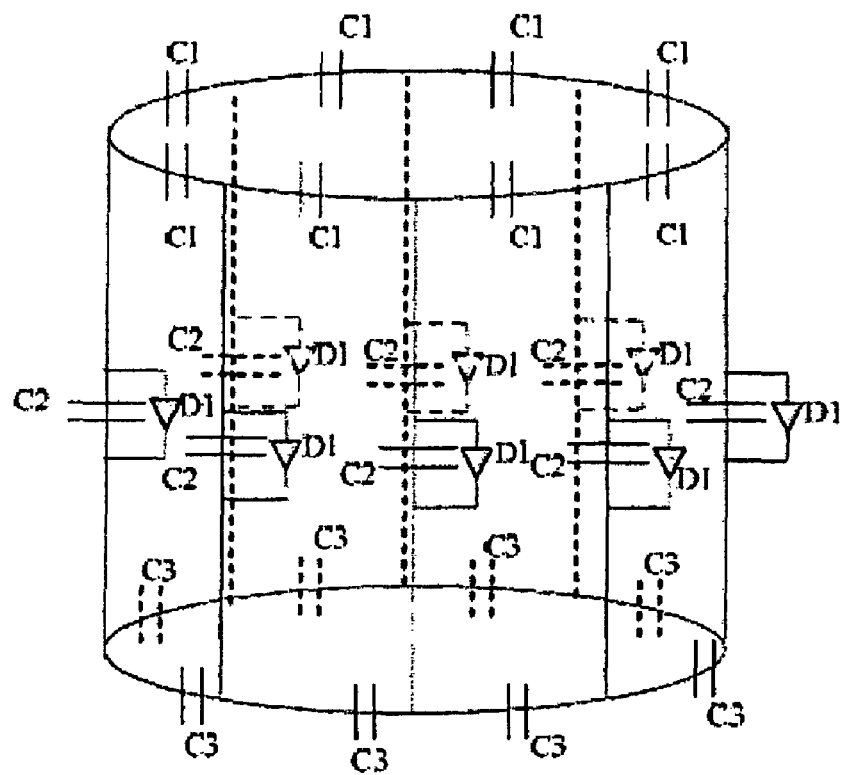
FIG. 3 is a schematic view of another local coil according to the embodiment of the present invention.

In the case of the local coil having a number of coil units, in order to eliminate the coupling between various coil units, as shown in FIG. 3, on the basis of the structure shown in FIG. 2, a second capacitor C2 is arranged at the connected edge between every two connected coil units in each of the cylinders, serving as a decoupling component, the second capacitor C2 is preferably positioned in the middle of the connected edge, and more preferably it is positioned at the center position of the connected edge. The number of the second capacitors C2 is equal to the number of the coil units in the local coil, and these second capacitors are preferably of the same properties. By adjusting these second capacitors C2, the coupling between the coil units can be eliminated.

Figure 4:
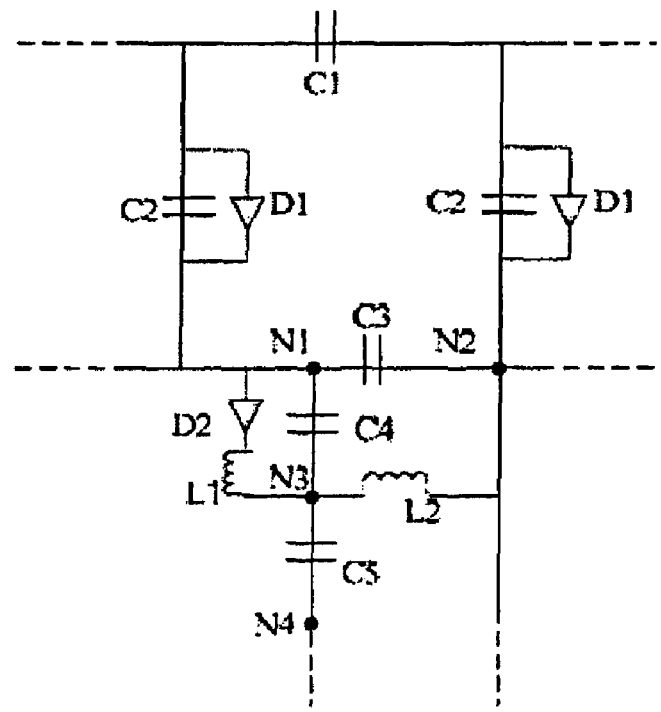
FIG. 4 is a schematic view of an embodiment of a coil unit in the local coil shown in FIG. 3, in which the other coil units are omitted at the left side and the right side, and the coil plug that can be connected with the local coil is omitted at the lower side.

As shown in FIGS. 3 and 4, in order to eliminate the influence of the second capacitors C2 during the phase for transmitting radio frequency signals, the embodiment of the present invention also arranges a bypass for each of the second capacitors C2, i.e., each of the second capacitors C2 is connected in parallel with a first diode D1. The number of the first diodes D1 is equal to the number of the second capacitors C2. In which case, the positive pole of the first diode D1 is connected with that end of the second capacitor C2 which is close to the first capacitor C1, and the negative pole of the first diode D1 is connected with the end of the second capacitor C2 which is further away from the first capacitor C1.

During the phase for transmitting radio frequency signals, the first diode D1 is conductive, thus short-circuiting the positive pole and the negative pole of the second capacitor C2, thereby it eliminates the influence of the second capacitor C2. During the phase for receiving magnetic resonance signals, the first diode D1 is cut-off (non-conductive), and the second capacitor C2 works to eliminate the coupling between adjacent coil units.

In order to match with the subsequent devices, in each of the cylinders, third capacitors C3 can be arranged respectively in each of the coil units at the edges at the other bottom face of the cylinder (opposite to the bottom face shown in FIG. 2 where the first capacitors C1 are located), as shown in FIG. 3 and FIG. 4. Each of the third capacitors C3 is preferably positioned in the middle of the corresponding edge of the coil unit, and preferably it is positioned at the center position of the corresponding edge. The number of the third capacitors C3 is equal to the number of the coil units, and the third capacitors are preferably of the same properties. As shown in FIG. 4, the radio frequency cables that introduce magnetic resonance signals can be connected at a first node N1 and a second node N2 of two ends of the third capacitor C3.

In order to prevent the radio frequency signals being forwarded into the subsequent low-noise amplifier and burning out the amplifier during the phase for transmitting radio frequency signals, as shown in FIG. 4, between the first node N1 and a corresponding third node N3 in the radio frequency cables is connected in parallel a fourth capacitor C4 and a first inductor L1, and is also arranged a second diode D2 connected with the first inductor L1. The fourth capacitor C4, the first inductor L1 and the second diode D2 form a switch circuit. The positive pole of the second D2 is connected with one end N1 of the third capacitor C3, while the negative pole of the second diode D2 is connected with the first inductor L1. In the case of the first diode D1 and the second diode D2 being included, the directions of the first diode D1 and the second diode D2 are identical.

During the phase for transmitting radio frequency signals, the diode D2 is conductive, and the fourth capacitor C4 and the first inductor L1 form an LC resonance circuit, so the radio frequency circuit of the radio frequency cables is cut-off, thus preventing the radio frequency signals from being forwarded to the subsequent amplifier, and preventing the amplifier from being burned out. During the phase for receiving magnetic resonance signals, the diode D2 is cut-off, and the magnetic resonance signals received by the coil units are forwarded to the subsequent devices via the fourth capacitor C4. Preferably, each group of the fourth capacitor C4 connected to each coil unit, the first inductor L1 and the second diode D2 has respectively identical properties.

As shown in FIG. 4, in the radio frequency cables connected to each of the coil units, a second inductor L2 and a fifth capacitor C5 can also be further connected. In which case, the second inductor L2 is connected between the second node N2 and the third node N3, and the fifth capacitor is connected with the third node N3 and connected between the third node N3 and a corresponding fourth node N4 in the radio frequency cable.

In FIG. 4, the second diode D2, the first inductor L1, the fourth capacitor C4 and so on can be connected at the first node N1, and also can be connected to the second node N2.

In FIG. 4, the second node N2 and the fourth node N4 are connected to the amplifier, and are then connected to the subsequent devices via long radio frequency cables between the coil plug and the subsequent devices.

FIG. 6(a) is the computer screen shot of the signal-to-noise ratio of a cross-section image obtained by experiments with the local coil as shown in FIG. 3 and FIG. 4; FIG. 6(b) is the computer screen shot of the signal-to-noise ratio of a sagittal plane image obtained by experiments with the local coil as shown in FIG. 3 and FIG. 4. As shown in FIG. 6(a), the signal-to-noise ratio at the center of the cross-section image is 1617.5; as shown in FIG. 6(b), the signal-to-noise ratio at the center of the sagittal plane image is 1621.6. This shows that, by using the local coil as shown in FIG. 3 and FIG. 4 in the embodiment of the present invention, the signal-to-noise ratio of the magnetic resonance image can be improved. In addition, it can be seen only from the light and dark degree of the image that by using the local coil as shown in FIG. 3 and FIG. 4 in the embodiment of the present invention the signal-to-noise ratios of the image at various positions can also be made more uniform.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for processing radio frequency signals of a magnetic resonance imaging system, said magnetic resonance imaging system comprising a body coil and a local coil, the method comprising:
    providing to said body coil the radio frequency signals to be transmitted and, with said body coil, coupling said radio frequency signals to said local coil;
    emitting said radio frequency signals from said local coil into a region to be examined;
    receiving, by said local coil, magnetic resonance signals from said region to be examined, and outputting said magnetic resonance signals from said local coil via a plurality of radio frequency cables;
    arranging in each of said coil units a decoupling component that eliminates coupling between said coil units; and
    eliminating the coupling between said coil units by means of said decoupling components during a phase for receiving the magnetic resonance signals.

2. The method as claimed in claim 1, comprising:
    adjusting said local coil to make said local coil form power coupling with said body coil.

3. The method as claimed in claim 2, comprising adjusting said local coil by:
    arranging a capacitor respectively in each of a plurality of coil units of said local coil; and
    adjusting said capacitors to make a primary mode frequency of said local coil equal to a primary mode frequency of said body coil.

4. The method as claimed in claim 1, comprising:
    receiving, by said local coil, magnetic resonance signals from said region to be examined, and coupling said magnetic resonance signals to said body coil.

5. The method as claimed in claim 1 comprising:
    arranging a switch circuit in each of said coil units; and
    switching off the radio frequency channels of said radio frequency cables by means of said switch circuits during the phase for transmitting radio frequency signals.

6. The method as claimed in claim 1, comprising:
    arranging a bypass respectively for each of said decoupling components; and
    short-circuiting said decoupling components by means of said bypasses during a phase for transmitting the radio frequency signals.

7. A radio frequency system, comprising:
    a local coil and a body coil configured for power coupling between said local coil and said body coil;
    during a phase for transmitting radio frequency signals, said body coil being configured to couple the radio frequency signals to be transmitted to said local coil, and said local coil being configured to emit said coupled radio frequency signals into a region to be examined;
    said local coil comprising a plurality of coil units forming a cylindrical arrangement comprising a single cylinder or a plurality of cylinders that are adjacent in succession to one another in an axial direction;
    within said cylindrical arrangement, the coil units being connected to one another in succession in the circumferential direction of the cylindrical arrangement, each of the coil units comprising a first capacitor, said first capacitors each located at the edge of the respective coil unit at the same bottom face of the cylinder, and the first capacitors being adjusted so as to produce power coupling between said local coil and said body coil;
    said local coil further comprising second capacitors that eliminate couplings between said coil units, with the number of said second capacitors being equal to the number of said coil units, said second capacitors being located respectively at the connected edges of every two connected coils; and
    each of the second capacitors also being connected in parallel with a diode, and said diodes being conductive during the phase for transmitting the radio frequency signals, and being blocking during the phase for receiving magnetic resonance signals.

8. The radio frequency system as claimed in claim 7, wherein the coil units, located in the cylindrical arrangement at any end of said local coil, converge towards the end face of said end.

9. The radio frequency system as claimed in claim 7, wherein said cylindrical arrangement comprises a further capacitor in the respective coil unit in the edge at the other bottom face of said cylindrical arrangement.

10. The radio frequency system as claimed in claim 7 wherein in each coil unit, the further capacitor is located in the middle of the edge where the first capacitor is located.

11. The radio frequency system as claimed in claim 7 wherein said further capacitor is adjustable so as to make a primary mode frequency of said local coil equal to a primary mode frequency of said body coil.

12. The radio frequency system as claimed in claim 7, wherein the number of said further capacitors being is equal to the number of said coil units, and each further capacitor is located at the edge of a coil unit at the other bottom face of the cylinder.

13. The radio frequency system as claimed in claim 12, having a first node and a second node at two ends of each of the further capacitors, said first and second modes being respectively connected with radio frequency cables for outputting the magnetic resonance signals received by said coil units.

14. The radio frequency system as claimed in claim 12 comprising an additional capacitor, an inductor and a diode are connected in each of said radio frequency cables, said first inductor and said diode being connected in series, and this series circuit and the additional capacitor being connected in parallel between said first node and a third node in said radio frequency cables, and said diode being conductive during the phase for transmitting the radio frequency signals, and blocking during the phase for receiving the magnetic resonance signals.

15. The radio frequency system as claimed in claim 14, wherein said inductor is a first inductor, and comprising a second inductor connected between each of the second nodes and the respective third node, and a capacitor connected at said third node.

* * * * *